United States Patent
Xie et al.

(10) Patent No.: US 11,486,050 B1
(45) Date of Patent: Nov. 1, 2022

(54) LIQUID MIXTURE FOR FILLING BLIND HOLES IN COPPER FOIL

(71) Applicant: Xiamen University of Technology, Xiamen (CN)

(72) Inventors: An Xie, Xiamen (CN); Dongya Sun, Xiamen (CN); Xiangjun Lu, Xiamen (CN); Yuechan Li, Xiamen (CN); Chunyan Cao, Xiamen (CN); Liang Yang, Xiamen (CN)

( * ) Notice: Subject to any disclaimer, the term of this patent is extended or adjusted under 35 U.S.C. 154(b) by 0 days.

(21) Appl. No.: 17/542,539

(22) Filed: Dec. 6, 2021

(30) Foreign Application Priority Data

Apr. 25, 2021 (CN) .......................... 202110446738.0

(51) Int. Cl.
  *C25D 3/38* (2006.01)
  *C25D 7/06* (2006.01)
  *H05K 3/42* (2006.01)

(52) U.S. Cl.
  CPC ............... *C25D 3/38* (2013.01); *C25D 7/06* (2013.01); *H05K 3/421* (2013.01); *H05K 2203/0723* (2013.01); *H05K 2203/0779* (2013.01)

(58) Field of Classification Search
  CPC ..................................................... C25D 3/38

USPC .......................................................... 205/298
See application file for complete search history.

(56) References Cited

U.S. PATENT DOCUMENTS

2010/0276292 A1* 11/2010 Webb ....................... C25D 3/38
                                                        204/243.1

FOREIGN PATENT DOCUMENTS

JP           2014185390 A  * 10/2014  ............... C25D 3/38

OTHER PUBLICATIONS

Ogutu et al., "Superconformal Filling of High Aspect Ratio Through Glass Vias (TGV) for Interposer Applications Using TNBT and NTBC Additives," Journal of the Electrochemical Society (Jun. 2, 20156), vol. 162, No. 9, pp. D457-D464. (Year: 2015).*

* cited by examiner

*Primary Examiner* — Edna Wong
(74) *Attorney, Agent, or Firm* — W&K IP

(57) ABSTRACT

Provided is a liquid mixture for filling blind holes in copper foil, relating to the technical field of electroplating hole filling. The liquid mixture comprises copper sulfate pentahydrate 210-240 g/L, citric acid 40-50 g/L, tartaric acid 10-20 g/L, chloride ion 40-70 ppm, accelerator 0.5-2 g/L, leveling agent 5-15 g/L, inhibitor 5-10 g/L, and sulfonate ion liquid 50-180 g/L. The leveling agent comprises tetranitro blue tetrazolium blue and triazolyl acetyl hydrazide.

8 Claims, No Drawings

LIQUID MIXTURE FOR FILLING BLIND HOLES IN COPPER FOIL

CROSS REFERENCE OF RELATED APPLICATIONS

The present disclosure claims the benefit of Chinese Patent Application No. 202110446738.0 entitled "Liquid Mixture for Filling Blind Holes in Copper Foil," filed on Apr. 25, 2021, in the China National Intellectual Property Administration, the entire content of which is incorporated herein in its entirety.

TECHNICAL FIELD

The present disclosure relates to the technical field of electroplating technology, in particularly to a liquid mixture for filling blind holes in copper foil.

BACKGROUND

In the manufacturing process of the printed circuit board industry, the blind holes are ablated by the laser of the laser drilling machine to realize the conduction and interconnection between the layers of the multilayer board. In the subsequent process, the blind holes need to be filled with electroplated copper. With the development of the integration of electronic information products, the hole diameter of the blind holes of the printed circuit board has become smaller, and the plate thickness/aperture ratio has increased. When the blind hole is filled by electroplating, the plating lines in the electroplating system are in the hole and the hole. It is easy to be unevenly distributed, causing holes in the hole, resulting in loss of transmission signal.

SUMMARY

The purpose of the present disclosure is to provide a novel liquid mixture for filling blind holes in copper foil. The liquid mixture is used for electroplating and filling holes, which can realize the filling of blind holes with high aspect ratio and high filling quality.

The present disclosure is achieved by the liquid mixture as follows.

The present disclosure provides a liquid mixture for filling blind holes in copper foil. The liquid mixture comprises copper sulfate pentahydrate 210-240 g/L, citric acid 40-50 g/L, tartaric acid 10-20 g/L, chloride ion 40-70 ppm, accelerator 0.5-2 g/L, leveling agent 5-15 g/L, inhibitor 5-10 g/L, and sulfonate ion liquid 50-180 g/L; the leveling agent comprises tetranitro blue tetrazolium blue and triazolyl acetyl hydrazide.

The structural formula of the tetranitro blue tetrazolium blue is:

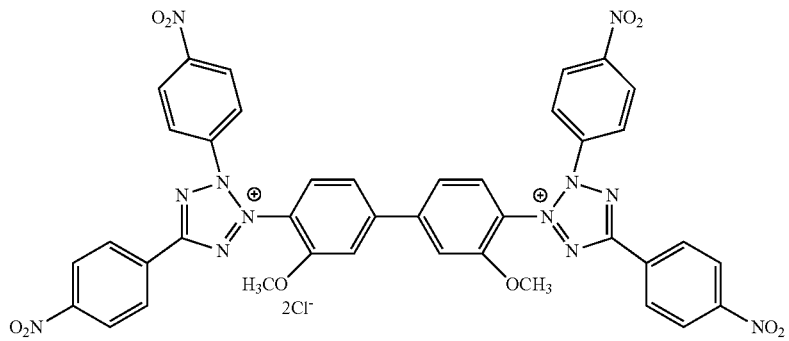 [SMILES: COc1cc(-c2ccc(-[n+]3nc(-c4ccc([N+](=O)[O-])cc4)nn3-c3ccc([N+](=O)[O-])cc3)c(OC)c2)ccc1-[n+]1nc(-c2ccc([N+](=O)[O-])cc2)nn1-c1ccc([N+](=O)[O-])cc1]

In some embodiments, the triazolyl acetyl hydrazide is obtained according to the following steps: adding acetone, potassium carbonate, triazole and ethyl chloroacetate to a reaction flask, and a mass ratio of the potassium carbonate, triazole and ethyl chloroacetate is 2:0.8-1:1.5-2; heating up to 80-100° C.; refluxing for 5-7 h; filtering with suction and concentrating under reduced pressure to obtain a reactant; dispersing the reactant and hydrazine hydrate having a mass ratio of 2-3:1 in ethanol; heating and refluxing for 5-7 h, resting for a night after concentrating under reduced pressure; and recrystallizing with ethanol to obtain the triazolyl acetyl hydrazide.

In some embodiments, the accelerator is one or more selected from the group consisting of sodium polydithiodipropane sulfonate, sodium 3-thio-1-propanesulfonate, dimethyl-dithioformamide sulfonic acid, polyethylene glycol-toluenesulfonic acid and hydroxypoly ethylene glycol sulfonic acid.

In some embodiments, the accelerator is a mixture of hydroxypolyethylene glycol sulfonic acid and sodium polydithiodipropane sulfonate having a mass ratio of 1:1-2.

In some embodiments, the inhibitor is one or more selected from the group consisting of aromatic polyoxyethylene ether, nonylphenol polyoxyethylene ether and copolyether.

In some embodiments, the copolyether is obtained according to the following steps: adding propylene glycol and potassium hydroxide to a reaction kettle according to a molar ratio of 1:2; after vacuum dehydration, adding mixed ethylene oxide and propylene oxide, and reacting at 115° C. and 0.3-0.4 MPa for 1-2 h; after neutralization, adsorption and filtration, obtaining a hydroxyl polyether; adding the hydroxyl polyether, potassium hydroxide and calcium oxide into the reaction flask, reacting at 95-110° C. for 1-3 h; adding bromobutane dropwise after stirring, and continuing the reaction for 6-7 h; and neutralizing with water and filtering to obtain the copolyether.

In some embodiments, the structural formula of the sulfonate ion liquid is:

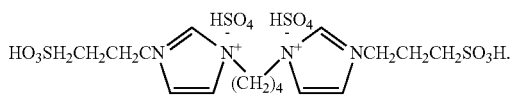

In some embodiments, the dosage ratio of the tetranitro blue tetrazolium blue and the triazolyl acetyl hydrazide is 1:0.1-0.4.

The advantages of the liquid mixture for filling blind holes in copper foil according to the embodiments of the present disclosure are as follows:

The following specifically describes the embodiments of the present disclosure.

The present disclosure provides a liquid mixture for filling blind holes in copper foil. The liquid mixture comprises copper sulfate pentahydrate 210-240 g/L, citric acid 40-50 g/L, tartaric acid 10-20 g/L, chloride ion 40-70 ppm, accelerator 0.5-2 g/L, leveling agent 5-15 g/L, inhibitor 5-10 g/L, and sulfonate ion liquid 50-180 g/L; the leveling agent comprises tetranitro blue tetrazolium blue and triazolyl acetyl hydrazide.

The structural formula of the tetranitro blue tetrazolium blue is:

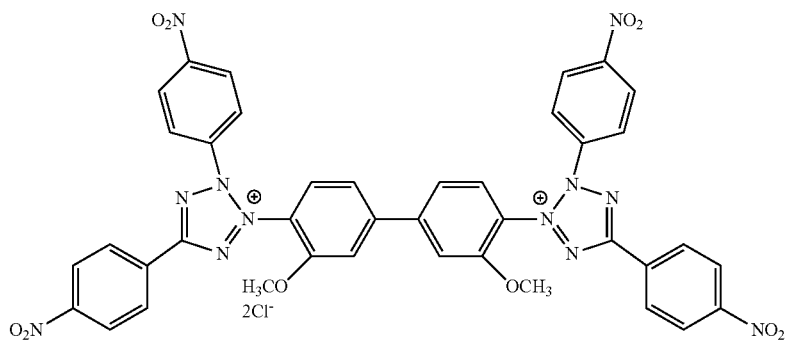 [SMILES: COc1cc(-c2ccc(-[n+]3nc(-c4ccc([N+](=O)[O-])cc4)nn3-c3ccc([N+](=O)[O-])cc3)c(OC)c2)ccc1-[n+]1nc(-c2ccc([N+](=O)[O-])cc2)nn1-c1ccc([N+](=O)[O-])cc1]

Tetranitro blue tetrazolium blue and triazolyl acetyl hydrazide have quaternary ammonium cations and multiple nitro groups. These functional groups can strongly bind to such negatively charged parts at the orifice and inhibit the speed of copper plating at the orifice. To avoid the cavities in the hole caused by the rapid closure of the orifice. At the same time, organic acid is used instead of sulfuric acid to adsorb on the cathode electrode, and tartaric acid and citric acid are used to replace sulfuric acid in traditional electroplating baths. Citric acid and tartaric acid can interact synergistically to inhibit copper deposition. Citric acid and tartaric acid can provide protons for the reduction of tetranitro blue tetrazolium blue at a higher cathodic potential. The inhibitory mechanism of tetranitro blue tetrazolium blue after reduction has been transformed from adsorption and blocking to complexation. Avoid cracked copper structures or undesirable filling effects.

In addition, through the combination of accelerators, levelers, inhibitors, and sulfonate-containing ionic liquids, the liquid mixture obtained when used for copper plating on blind holes has a high porosity filling rate and few holes in the holes, which avoids signal transmission to the greatest extent. Loss, effectively improve the reliability and stability of electronic products.

DETAILED DESCRIPTION OF THE EMBODIMENTS

In order to make the objectives, technical solutions, and advantages of the embodiments of the present invention clearer, the technical solutions in the embodiments of the present invention will be described clearly and completely below. If specific conditions are not indicated in the examples, it shall be carried out in accordance with the conventional conditions or the conditions recommended by the manufacturer. The reagents or instruments used without the manufacturer's indication are all conventional products that can be purchased on the market.

Furthermore, preferably, the triazolyl acetyl hydrazide is obtained according to the following steps: adding acetone, potassium carbonate, triazole and ethyl chloroacetate to a reaction flask, and a mass ratio of the potassium carbonate, triazole and ethyl chloroacetate is 2:0.8-1:1.5-2; heating up to 80-100° C.; refluxing for 5-7 h; filtering with suction and concentrating under reduced pressure to obtain a reactant; dispersing the reactant and hydrazine hydrate having a mass ratio of 2-3:1 in ethanol; heating and refluxing for 5-7 h, resting for a night after concentrating under reduced pressure; and recrystallizing with ethanol to obtain the triazolyl acetyl hydrazide.

Furthermore, in some preferable embodiments, the dosage ratio of the tetranitro blue tetrazolium blue and the triazolyl acetyl hydrazide is 1:0.1-0.4.

The compounding of triazolyl acetyl hydrazide and tetranitro blue tetrazolium blue can strengthen the inhibitory effect of the leveling agent on the copper plating of the orifice, and realize the ideal filling of the high aspect ratio blind micro-hole filling.

Furthermore, in some preferably embodiments, the accelerator is one or more selected from the group consisting of sodium polydithiodipropane sulfonate, sodium 3-thio-1-propanesulfonate, dimethyl-dithioformamide sulfonic acid, polyethylene glycol-toluenesulfonic acid and hydroxypoly ethylene glycol sulfonic acid. Furthermore, the accelerator is a mixture of hydroxypolyethylene glycol sulfonic acid and sodium polydithiodipropane sulfonate having a mass ratio of 1:1-2. The selection of the above accelerator components is beneficial to further reduce the polarization, promote the deposition of copper in the deep hole, and refine the crystal grains.

Furthermore, in some preferably embodiments, the inhibitor is one or more selected from the group consisting of aromatic polyoxyethylene ether, nonylphenol polyoxyethylene ether and copolyether.

Furthermore, in some preferable embodiments, the copolyether is obtained according to the following steps: adding propylene glycol and potassium hydroxide to a reaction kettle according to a molar ratio of 1:2; after vacuum dehydration, adding mixed ethylene oxide and propylene oxide, and reacting at 115° C. and 0.3-0.4 MPa for 1-2 h; after neutralization, adsorption and filtration, obtaining a hydroxyl polyether; adding the hydroxyl polyether, potassium hydroxide and calcium oxide into the reaction flask, reacting at 95-110° C. for 1-3 h; adding bromobutane dropwise after stirring, and continuing the reaction for 6-7 h; and neutralizing with water and filtering to obtain the copolyether. The copolyether obtained by these steps has a terminal hydroxyl group substituted by an alkyl group, has better wetting performance, can effectively reduce the surface tension, and cooperates with an accelerator to form a good filling of micro-deep pores.

In some embodiments, the structural formula of the sulfonate ion liquid is:

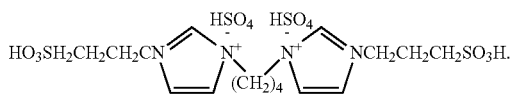

The ionic liquid with sulfonate groups is added to the electroplating bath, the electrochemical stability of the plating solution is better, and the sulfonate groups can interact with the accelerator to improve the copper plating speed of blind holes.

The embodiment of the present disclosure also provides a filling method for roll-to-roll copper foils, which includes the following steps:

S1, the sample to be plated is covered with a film, and the position of the blind hole is exposed, and then immersed in the pretreatment solution, ultrasonically treated for 1 to 5 minutes, and then taken out, and the pretreatment sample is obtained after the film is removed. Among them, the pretreatment liquid is a polyethylene glycol aqueous solution containing 1 to 5 g/L of small molecule active agent and 0.5 to 2 g/L of accelerator. Preferably, the mass fraction of polyethylene glycol in the polyethylene glycol aqueous solution is 2 to 3%. Further preferably, the polyethylene glycol solution also contains nickel nanoparticles with a mass fraction of 0.5 to 0.7%.

S2, electroplating the pretreatment template with hole filling, and carrying out hole filling electroplating according to the following stages:

The first stage: the plating solution is copper sulfate pentahydrate 210-240 g/L, citric acid 40-50 g/L, chloride ion 40-70 ppm, leveling agent 5-15 g/L, inhibitor 5-10 g/L and sulfur The acid radical ionic liquid is 50-180 g/L; the leveling agent includes tetranitro blue tetrazolium blue and triazolyl acetylhydrazine, the current density is 1.2-1.4 A/m$^2$, and the electroplating time is 10-15 min;

The second stage: add 10-20 g/L tartaric acid to the plating solution, the current density is 1.8-2.2 A/m$^2$, and the plating time is 15-20 min;

The third stage; the current density is 2.2-2.4 A/m$^2$, and the electroplating time is 5-10 min.

Among them, the accelerator, leveling agent, inhibitor and other additives can be found in the introduction of the above-mentioned liquid mixture.

The features and performance of the present invention will be further described in detail below in conjunction with the embodiments.

Example 1

A liquid mixture for filling blind holes in copper foil provided by this embodiment includes:

copper liquid: copper sulfate pentahydrate 220 g/L, chloride ion 60 ppm;
acid solution: citric acid 45 g/L, tartaric acid 15 g/L;
accelerator: Hydroxypolyethylene glycol sulfonic acid 0.5 g/L, sodium polydithiodipropane sulfonate 0.8 g/L;
leveling agent: tetranitro blue tetrazolium blue 6 g/L, triazolyl acetylhydrazine 1.8 g/L;
inhibitor: aromatic polyoxyethylene ether 4 g/L and copolyether 4 g/L. The copolyether was prepared as follows: propylene glycol and potassium hydroxide were added to the reactor according to a molar ratio of 1:2, after vacuum dehydration, mixed ethylene oxide and propylene oxide were added, and the reaction was carried out at 115° C. and 0.4 MPa for 1.5 h. After neutralization, adsorption and filtration, the hydroxyl polyether is obtained. Add the hydroxyl polyether, potassium hydroxide and calcium oxide to the reaction flask, and react at 100° C. for 2 hours. After stirring, add bromobutane dropwise to continue the reaction 6.5 After h, the copolyether is obtained by washing, neutralizing, and filtering;
the balance is deionized water.

Example 2

A liquid mixture for filling blind holes in copper foil provided by this embodiment includes:

copper liquid: copper sulfate pentahydrate 220 g/L, chloride ion 60 ppm;
acid solution: citric acid 45 g/L, tartaric acid 15 g/L;
accelerator: sodium polydisulfide dipropane sulfonate 1.3 g/L;
leveling agent: tetranitro blue tetrazolium blue 6 g/L, triazolyl acetylhydrazine 1.8 g/L;
inhibitor: aromatic polyoxyethylene ether 8 g/L;
the balance is deionized water.

Comparative Example 1

This comparative example provides a liquid mixture for filling blind holes in copper foil, including:

copper liquid: copper sulfate pentahydrate 220 g/L, chloride ion 60 ppm;
acid solution: sulfuric acid 60 g/L;
accelerator: Hydroxypolyethylene glycol sulfonic acid 0.5 g/L, sodium polydithiodipropane sulfonate 0.8 g/L;
leveling agent: tetranitro blue tetrazolium blue 6 g/L, triazolyl acetylhydrazine 1.8 g/L;
inhibitor: aromatic polyoxyethylene ether 4 g/L and copolyether 4 g/L. The copolyether was prepared as follows: propylene glycol and potassium hydroxide were added to the reactor according to a molar ratio of 1:2, after vacuum dehydration, mixed ethylene oxide and propylene oxide were added, and the reaction was carried out at 115° C. and 0.4 MPa for 1.5 h. After neutralization, adsorption and filtration, the hydroxyl polyether is obtained. Add the hydroxyl polyether, potassium hydroxide and calcium oxide to the reaction flask, and react at 100° C. for 2 hours. After stirring, add bromobutane dropwise to continue the reaction for 6.5 h, the copolyether is obtained by washing, neutralizing, and filtering;
the balance is deionized water.

Comparative Example 2

This comparative example provides a liquid mixture for filling blind holes in copper foil, copper liquid: copper sulfate pentahydrate 220 g/L, chloride ion 60 ppm;

acid solution: citric acid 45 g/L, tartaric acid 15 g/L;

accelerator: hydroxypolyethylene glycol sulfonic acid 0.5 g/L, sodium polydithiodipropane sulfonate 0.8 g/L;

leveling agent: tetranitro blue tetrazolium blue 7.8 g/L;

inhibitor: aromatic polyoxyethylene ether 4 g/L and copolyether 4 g/L. The copolyether was prepared as follows: propylene glycol and potassium hydroxide were added to the reactor according to a molar ratio of 1:2, after vacuum dehydration, mixed ethylene oxide and propylene oxide were added, and the reaction was carried out at 115° C. and 0.4 MPa for 1.5 h. After neutralization, adsorption and filtration, the hydroxyl polyether is obtained. Add the hydroxyl polyether, potassium hydroxide and calcium oxide to the reaction flask, and react at 100° C. for 2 hours. After stirring, add bromobutane dropwise to continue the reaction 6.5 After h, the copolyether is obtained by washing, neutralizing, and filtering;

the balance is deionized water.

Example 3

This example provides a filling method for roll-to-roll copper foil blind holes, which includes the following steps.

(1) Prepare the liquid mixture in Example 1;

(2) Carry out coating treatment on the sample to be plated, and expose the position of the blind hole, then immerse it in the pretreatment liquid, ultrasonicate it at 260 W for 3 minutes, and then remove it. After removing the coating, the pretreatment sample is obtained. Among them, the pretreatment liquid is a 2 wt % polyvinyl alcohol aqueous solution, which contains 2 g/L of sodium dodecylbenzene sulfonate, 2 g/L of alkyl glucoside, and the accelerator in the liquid mixture in (1).

(3) The components of the liquid mixture in (1) except for the accelerator and tartaric acid are used as the plating solution, the current density is 1.2 A/m$^2$, and the plating time is 12 minutes.

(4) Add tartaric acid to the plating solution in (3), the current density is 2.0 A/m$^2$, and the plating time is 15 minutes;

(5) The current density is 2.4 A/m$^2$, and the plating time is 8 minutes.

Example 4

This example provides a filling method for roll-to-roll copper foil blind hole, which is different from Example 3 in that the pretreatment solution in step (2) contains 0.6 wt % of nano-nickel particles.

Example 5

This example provides a roll-to-roll copper foil blind hole filling method, which includes the following steps.

(1) Prepare the liquid mixture in Example 2;

(2) Carry out coating treatment on the sample to be plated, and expose the position of the blind hole, then immerse it in the pretreatment liquid, ultrasonicate it at 260 W for 3 minutes, and then remove it. After removing the coating, the pretreatment sample is obtained. Among them, the pretreatment liquid is a 2 wt % polyvinyl alcohol aqueous solution, which contains 2 g/L of sodium dodecylbenzene sulfonate, 2 g/L of alkyl glucoside, and the accelerator in the liquid mixture in (1).

(3) The components of the liquid mixture in (1) except for the accelerator and tartaric acid are used as the plating solution, the current density is 1.2 A/m$^2$, and the plating time is 12 minutes.

(4) Add tartaric acid to the plating solution in (3), the current density is 2.0 A/m$^2$, and the plating time is 15 minutes;

(5) The current density is 2.4 A/m$^2$, and the plating time is 8 minutes.

Comparative Example 3

This comparative example provides a filling method for roll-to-roll copper foil blind hole, which includes the following steps:

(1) Prepare the liquid mixture in Comparative Example 1;

(2) Carry out coating treatment on the sample to be plated, and expose the position of the blind hole, then immerse it in the pretreatment liquid, ultrasonicate it at 260 W for 3 minutes, and then remove it. After removing the coating, the pretreatment sample is obtained. Among them, the pretreatment liquid is a 2 wt % polyvinyl alcohol aqueous solution, which contains 2 g/L of sodium dodecylbenzene sulfonate, 2 g/L of alkyl glucoside, and the accelerator in the liquid mixture in (1).

(3) The composition of the of liquid mixture in (1) except for the accelerator is the plating solution, the current density is 1.2 A/m$^2$, and the plating time is 12 minutes.

(4) The current density is 2.0 A/m$^2$, and the electroplating time is 15 minutes;

(5) The current density is 2.4 A/m$^2$, and the plating time is 8 minutes.

Comparative Example 4

(1) Prepare the liquid mixture in Comparative Example 2;

(2) Carry out coating treatment on the sample to be plated, and expose the position of the blind hole, then immerse it in the pretreatment liquid, ultrasonicate it at 260 W for 3 minutes, and then remove it. After removing the coating, the pretreatment sample is obtained. Among them, the pretreatment liquid is a 2 wt % polyvinyl alcohol aqueous solution, which contains 2 g/L of sodium dodecylbenzene sulfonate, 2 g/L of alkyl glucoside, and the accelerator in the liquid mixture in (1).

(3) The components of the liquid mixture in (1) except for the accelerator and tartaric acid are used as the plating solution, the current density is 1.2 A/m$^2$, and the plating time is 12 minutes.

(4) Add tartaric acid to the plating solution in (3), the current density is 2.0 A/m$^2$, and the plating time is 15 minutes;

(5) The current density is 2.4 A/m$^2$, and the plating time is 8 minutes.

Comparative Example 5

This comparative example provides filling method for a roll-to-roll copper foil blind hole, which includes the following steps.

(1) Prepare the liquid mixture in Example 1;

(2) Use the liquid mixture in (1) as the plating solution, the current density is 1.2 A/m$^2$, and the plating time is 12 minutes.

(4) The current density is 2.0 A/m$^2$, and the electroplating time is 15 minutes;

(5) The current density is 2.4 A/m², and the plating time is 8 minutes.

Test Example

The samples (blind hole diameter 50 hole depth aspect ratio 0.75:1) obtained according to the methods of Examples 3 to 5 and Comparative Examples 3 to 5 were tested, and the test results are shown in Table 1.

TABLE 1

| Test Index | Example 3 | Example 4 | Example 5 | Comparative Example 3 | Comparative Example 4 | Comparative Example 5 |
|---|---|---|---|---|---|---|
| Filling rate | 98% | 100% | 94% | 71% | 88% | 91% |
| Flatness | Excellent | Excellent | Excellent | Poor | Good | Good |
| Internal holes | None | None | None | None | None | More |

The above are only the preferred embodiments of the present invention and are not used to limit the present invention. For those skilled in the art, the present invention can have various modifications and changes. Any modification, equivalent replacement, improvement, etc. made within the spirit and principle of the present invention shall be included in the protection scope of the present invention.

What is claimed is:

1. A liquid mixture for filling blind holes in copper foil, comprising:
   copper sulfate pentahydrate 210-240 g/L,
   citric acid 40-50 g/L,
   tartaric acid 10-20 g/L,
   chloride ion 40-70 ppm,
   accelerator 0.5-2 g/L,
   leveling agent 5-15 g/L,
   inhibitor 5-10 g/L, and
   sulfonate ion liquid 50-180 g/L;
   the leveling agent comprises tetranitro blue tetrazolium blue and triazolyl acetyl hydrazide;
   wherein the structural formula of the tetranitro blue tetrazolium blue is:

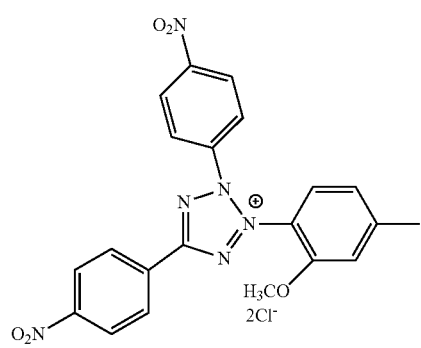

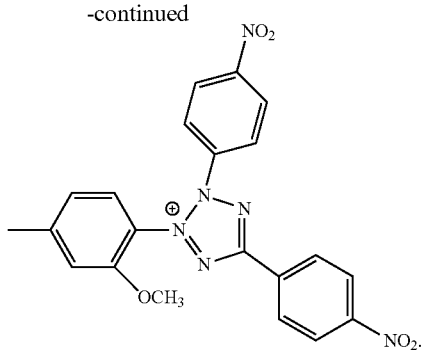

2. The liquid mixture according to claim 1, wherein the triazolyl acetyl hydrazide is obtained according to the following steps:
   adding acetone, potassium carbonate, triazole and ethyl chloroacetate to a reaction flask, and a mass ratio of the potassium carbonate, triazole and ethyl chloroacetate is 2:0.8-1:1.5-2;
   heating up to 80-100° C.;
   refluxing for 5-7 h;
   filtering with suction and concentrating under reduced pressure to obtain a reactant;
   dispersing the reactant and hydrazine hydrate having a mass ratio of 2-3:1 in ethanol;
   heating and refluxing for 5-7 h,
   resting for a night after concentrating under reduced pressure;
   recrystallizing with ethanol to obtain the triazolyl acetyl hydrazide.

3. The liquid mixture according to claim 1, wherein the accelerator is one or more selected from the group consisting of sodium polydithiodipropane sulfonate, sodium 3-thio-1-propanesulfonate, dimethyl-dithioformamide sulfonic acid, polyethylene glycol-toluenesulfonic acid and hydroxypoly ethylene glycol sulfonic acid.

4. The liquid mixture according to claim 3, wherein the accelerator is a mixture of hydroxypolyethylene glycol sulfonic acid and sodium polydithiodipropane sulfonate having a mass ratio of 1:1-2.

5. The liquid mixture according to claim 1, wherein the inhibitor is one or more selected from the group consisting of aromatic polyoxyethylene ether, nonylphenol polyoxyethylene ether and copolyether.

6. The liquid mixture according to claim 5, wherein the copolyether is obtained according to the following steps:
   adding propylene glycol and potassium hydroxide to a reaction kettle according to a molar ratio of 1:2;
   after vacuum dehydration, adding mixed ethylene oxide and propylene oxide, and reacting at 115° C. and 0.3-0.4 MPa for 1-2 h;
   after neutralization, adsorption and filtration, obtaining a hydroxyl polyether;
   adding the hydroxyl polyether, potassium hydroxide and calcium oxide into the reaction flask, reacting at 95-110° C. for 1-3 h;
   adding bromobutane dropwise after stirring, and continuing the reaction for 6-7 h; and
   neutralizing with water and filtering to obtain the copolyether.

7. The liquid mixture according to claim 1, wherein the structural formula of the sulfonate ion liquid is:

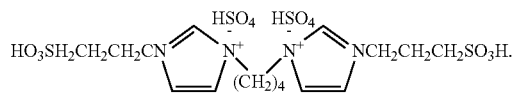
8. The liquid mixture according to claim 1, wherein the dosage ratio of the tetranitro blue tetrazolium blue and the triazolyl acetyl hydrazide is 1:0.1-0.4.
* * * * *